(12) United States Patent
Draxelmayr

(10) Patent No.: US 7,999,619 B2
(45) Date of Patent: Aug. 16, 2011

(54) CLASS AB OUTPUT STAGE

(75) Inventor: Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 12/367,989

(22) Filed: Feb. 9, 2009

(65) Prior Publication Data

US 2010/0201446 A1   Aug. 12, 2010

(51) Int. Cl.
*H03F 3/04* (2006.01)

(52) U.S. Cl. ........................................................ 330/288
(58) Field of Classification Search .................. 330/288; 323/315, 316
See application file for complete search history.

(56) References Cited

U.S. PATENT DOCUMENTS 5,841,603 A * 11/1998 Ramalho et al. ................. 360/68
7,724,092 B2 * 5/2010 Quan et al. ..................... 330/288
* cited by examiner

*Primary Examiner* — Steven J Mottola
(74) *Attorney, Agent, or Firm* — SpryIP, LLC

(57) ABSTRACT

The present disclosure relates to a class AB amplifier output stage.

9 Claims, 6 Drawing Sheets

CLASS AB OUTPUT STAGE

BACKGROUND

Several different amplifier circuit arrangements may be utilized to provide output signals. In one example, a class A amplifier circuit arrangement reproduces an entire input signal because an active element of the class A amplifier circuit arrangement, such as a transistor, is constantly in the active mode. However, class A amplifiers typically have a high power consumption because the active element does not stop conducting current.

In another example, a class B amplifier circuit arrangement reproduces half of the input signal since an active element of a class B amplifier circuit arrangement spends half of the time in active mode and the other half in cutoff. Class B amplifier circuit arrangements may include a push-pull configuration that has two active elements with one active element in active mode for half of an input waveform and the other active element in active mode for the other half of the input waveform. The properties of class B amplifier circuit arrangements may vary with load conditions and may suffer from harmonic distortion when the handoff from one element to another does not occur properly.

Class AB amplifier circuit arrangements are a mixture between class A amplifier circuit arrangements and class B amplifier circuit arrangements. Class AB amplifier circuit arrangements include two active elements that are in the active mode more than 50% of the time to decrease the amount of harmonic distortion that occurs during the handoff from one active element to another. Adjustment of output quiescent current in Class AB amplifier circuit arrangements may be problematic.

Some class AB amplifier circuit arrangements may utilize a stack of two diodes to adjust quiescent current. However, such arrangements do not typically operate well at low supply voltages because the stack of two diodes requires a relatively high supply voltage. Other class AB amplifier circuit arrangements may operate at low supply voltages, but may have increased current consumption. For example, class AB amplifier circuit arrangements may include current mirrors that generate a current internally and mirror the current to the output of the circuit arrangement. However, the current consumption of such class AB amplifier circuit arrangements is doubled. Still other class AB amplifier circuit arrangements may operate at low supply voltages and have low current consumption, but suffer from a poor power supply rejection ratio.

BRIEF DESCRIPTION OF THE DRAWINGS

The detailed description is described with reference to the accompanying figures. In the figures, the left-most digit(s) of a reference number identifies the figure in which the reference number first appears. The use of the same reference number in different instances in the description and the figures may indicate similar or identical items.

DETAILED DESCRIPTION

Figure 1:
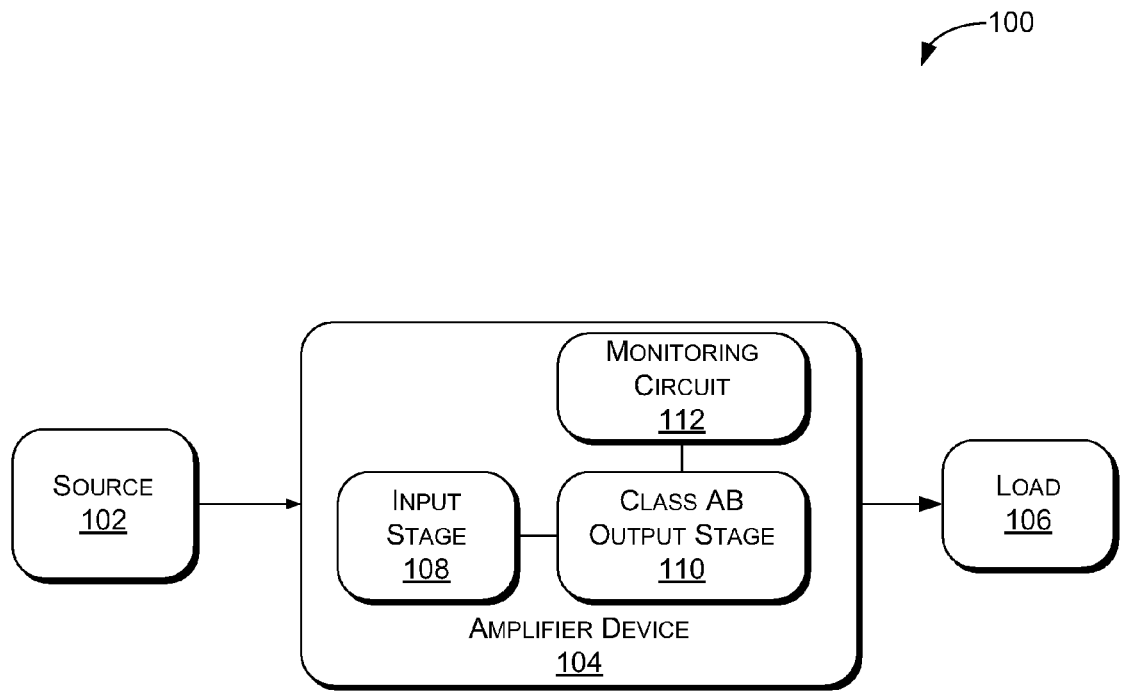
FIG. 1 is a schematic diagram of an amplifier circuit arrangement utilized to provide an amplified input signal from a source to a load.

This disclosure describes at least one class AB amplifier output stage circuit arrangement that can operate at low supply voltages, with minimum current generated. Furthermore, at least one class AB amplifier stage circuit arrangement described herein reacts favorably to a supply voltage, that is, exhibits a good power supply rejection ratio. Moreover, this disclosure describes class AB amplifier output stage circuit arrangements that include a negative channel metal oxide semiconductor (NMOS) transistor current mirror arrangement and a positive channel metal oxide semiconductor (PMOS) transistor current mirror arrangement. In some implementations, a monitoring circuit may be coupled to a class AB amplifier output stage circuit arrangement to offset mismatch that may occur in the class AB amplifier output stage.

According to one exemplary implementation, an apparatus includes a first current mirror arrangement coupled to a first input signal arrangement. The first input signal arrangement includes a first input current source and a first impedance. The apparatus also includes a second current mirror arrangement coupled to a second input signal arrangement. The second input signal arrangement includes a second input current source and a second impedance. The first current mirror arrangement is coupled to the second current mirror arrangement.

According to another implementation, an apparatus includes a first operational transconductance amplifier including an output node coupled to a first variable current source. The first operational transconductance amplifier determines a voltage drop of a first impedance. The apparatus also includes a second operational transconductance amplifier including an output node coupled to a second variable current source. The second operational transconductance amplifier determines a voltage drop of a second impedance. The output node of the second operational transconductance amplifier is coupled to the output node of the first operational transconductance amplifier.

According to another implementation, an apparatus includes a differential amplifier arrangement coupled to a first impedance of a class AB amplifier output stage and coupled to a second impedance of the class AB amplifier output stage. An output node of the differential amplifier arrangement is coupled to a variable current source arrangement and one or more input nodes of the differential amplifier arrangement are coupled to the first impedance and the second impedance.

According to another implementation, a method includes generating an output signal of a first amplifier circuit based on a voltage drop of a first impedance of a class AB amplifier output stage. The method also includes generating an output signal of a second amplifier circuit based on a voltage drop of a second impedance of a class AB amplifier output stage. The method further includes generating a compensating current when the voltage drop of the first impedance is different from the voltage drop of the second impedance. The compensating current adjusts the voltage drop of the first impedance, the voltage drop of the second impedance, or a combination thereof, such that the voltage drop of the first impedance and the voltage drop of the second impedance are adjusted to be approximately equal.

FIG. 1 is a schematic diagram of an apparatus 100 utilized to provide an amplified input signal from a source 102 to a load 106 via an amplifier device 104. In particular implementations, the source 102 may include one or more circuit arrangements that provide one or more input signals to the amplifier device 104. The input signals may include radio frequency signals, audio signals, digital signals, or other signals carrying data. The load 106 may include an additional device that receives the output of the amplifier device 104 as an input signal. For example, the load 106 may include an output device, such as an audio speaker, an analog to digital conversion circuit, a mixer, or a combination thereof. In some implementations, the circuit 100 may be included in a high speed amplifier.

The amplifier device 104 includes an input stage 108 and a class AB amplifier output stage 110. In an illustrative implementation, the input stage 108 may include one or more devices, such as operational amplifiers, to modify signals from the source 102 and provide the modified signals to the class AB amplifier output stage 110. In turn, the class AB amplifier output stage 110 may further modify the signals from the source 102 and provide these signals to the load 106. In a particular implementation, the class AB amplifier output stage 110 may include a positive channel metal oxide semiconductor (PMOS) transistor current mirror arrangement and a negative channel metal oxide semiconductor (NMOS) transistor current mirror arrangement. An impedance, such as a resistor or an arrangement of transistors, may be coupled between the transistors of the PMOS current mirror arrangement. An additional impedance may be coupled between the transistors of the NMOS current mirror arrangement. The circuit arrangement of the class AB amplifier output stage 110 is configured to provide good regulation of output quiescent current, while operating at low supply voltages or high supply voltages, with a good power supply rejection ratio, and minimum current consumption.

In some implementations, a monitoring circuit 112 may be utilized in the amplifier device 104 to reduce mismatch in the class AB amplifier output stage 110. In an illustrative implementation, the monitoring circuit 112 may include a first operational transconductance amplifier (OTA) to generate an output current based on a voltage drop of a first impedance coupled between transistors of a PMOS current mirror arrangement of the class AB amplifier output stage 110. The monitoring circuit 112 may also include a second OTA to generate an output current based on a voltage drop of a second impedance coupled between transistors of an NMOS current mirror arrangement of the class AB amplifier output stage 110. The output currents of the first OTA and the second OTA of the monitoring circuit 112 may be utilized to produce a compensating current to regulate the voltage drops of the impedances of the current mirror arrangements of the class AB amplifier output stage 110, such that the voltage drops are approximately equal, in order to provide good control of output quiescent current of the class AB amplifier output stage 110.

In some instances, the impedance values of the first impedance and the second impedance are approximately equal and the voltage drop of the first impedance and the voltage drop of the second impedance may be approximately equal when the first impedance and the second impedance receive approximately the same current. In other instances, the impedance values of the first impedance and the second impedance may be different and the current provided to the first impedance and the second impedance may correspond to the difference between the impedance values, such that the voltage drop of the first impedance and the voltage drop of the second impedance are approximately equal. For example, when the impedance value of the first impedance is larger than that of the second impedance, the current provided to the first impedance would be less than the current provided to the second impedance.

In another illustrative implementation, the monitoring circuit 112 may include a differential amplifier arrangement to offset mismatch in the class AB amplifier output stage 110. For example, the monitoring circuit 112 may include a first differential amplifier to determine a voltage drop of a first impedance coupled between transistors of a PMOS current mirror arrangement of the class AB amplifier output stage 110. The monitoring circuit 112 may also include a second differential amplifier to determine a voltage drop of a second impedance coupled between transistors of an NMOS current mirror arrangement of the class AB amplifier output stage 110. The first differential amplifier and the second differential amplifier may be coupled to a third differential amplifier that drives one or more auxiliary variable current sources to produce a compensating current when there is a difference between the voltage drop of the first impedance and the voltage drop of the second impedance. In an alternative implementation, the differential amplifier arrangement may include a differential difference amplifier that produces an output that drives the one or more auxiliary variable current sources to produce a compensating current when there is a difference between the voltage drop of the first impedance and the voltage drop of the second impedance.

Figure 2:
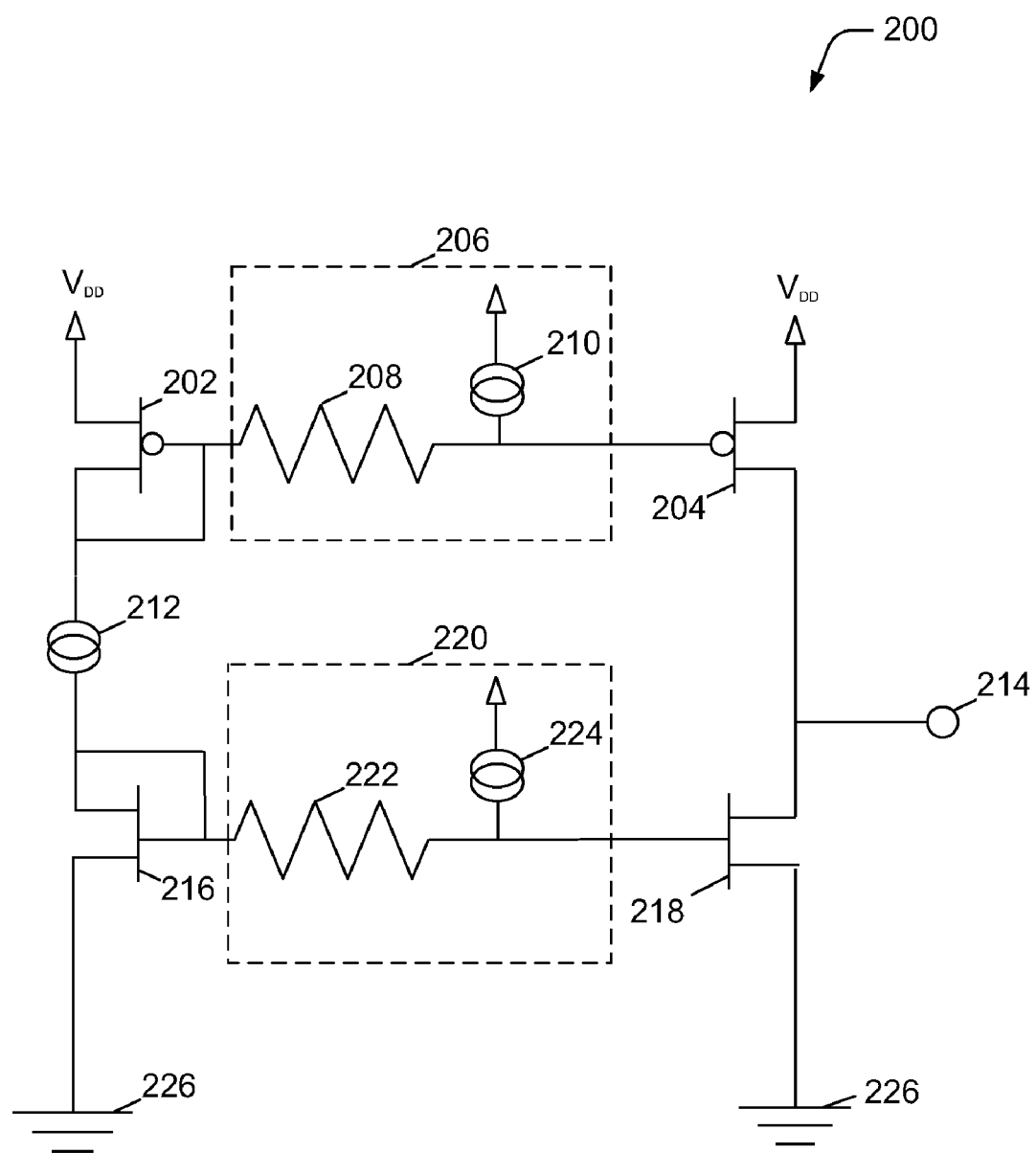
FIG. 2 is a schematic diagram of a class AB amplifier output stage circuit arrangement including a PMOS transistor current mirror arrangement and an NMOS transistor current mirror arrangement.

FIG. 2 is a schematic diagram of a class AB amplifier output stage circuit arrangement 200 including a PMOS transistor current mirror arrangement and an NMOS transistor current mirror arrangement. The PMOS transistor current mirror arrangement includes a first positive channel metal oxide semiconductor (PMOS) transistor 202 and a second PMOS transistor 204. The PMOS transistor current mirror arrangement is coupled to a first input signal arrangement 206. The first input signal arrangement 206 includes a first impedance 208 and a first input current source 210. A gate of the first PMOS transistor 202 is coupled to the first impedance 208 and a drain of the first PMOS transistor 202 is coupled to a reference current source 212. A source of the first PMOS transistor 202 is coupled to a supply voltage, $V_{DD}$. A gate of the second PMOS transistor 204 is coupled to the first impedance 208 and to the first input current source 210 and a drain of the second PMOS transistor 204 is coupled to an output terminal 214. Additionally, a source of the second PMOS transistor 204 is coupled to the supply voltage $V_{DD}$.

The NMOS transistor current mirror arrangement includes a first negative channel metal oxide semiconductor (NMOS) transistor 216 and a second NMOS transistor 218. The NMOS transistor current mirror arrangement is coupled to a second input signal arrangement 220. The second input signal arrangement 220 includes a second impedance 222 and a second input current source 224. A gate of the first NMOS transistor 216 is coupled to the second impedance 222 and a drain of the first NMOS transistor 216 is coupled to the reference current source 212. A source of the first NMOS transistor 216 is coupled to a ground 226. A gate of the second NMOS transistor 218 is coupled to the second impedance 222 and to the second input current source 224. A drain of the second NMOS transistor 218 is coupled to the output terminal 214 and a source of the second NMOS transistor 218 is coupled to the ground 226.

In some implementations, the reference current source 212 may be replaced by two separate matched current sources to provide appropriate bias currents to the PMOS transistor current mirror arrangement and the NMOS transistor current mirror arrangement. For example, one of the matched current sources may drive the first PMOS transistor 202 and the other matched current source may drive the first NMOS transistor 216.

In an illustrative implementation, the first input current source 210, the second input current source 224, or a combination thereof, may produce a negative input current decreasing the voltage at the gate of the second PMOS transistor 204 and decreasing the voltage at the gate of the second NMOS transistor 218. In response to a negative input current, the second PMOS transistor 204 may deliver an increased output current by producing an increased source to drain current that provides a current path between the supply voltage $V_{DD}$ and the output terminal 214. The output current of the second NMOS transistor 218 decreases in response to a negative input current. In some instances, such as with a large input current, the output current of the second NMOS transistor 218 is shut off and the second NMOS transistor 218 does not conduct any current. In this way, the output transistors 204 and 218 exhibit the desired push-pull behavior based on a negative input current.

In another illustrative implementation, the first input current source 210, the second input current source 224, or a combination thereof, may produce a positive input current increasing the voltage of the gate of the second PMOS transistor 204 and increasing the voltage of the gate of the second NMOS transistor 218. In response to a positive input current, the second NMOS transistor 218 delivers an increased output current, while the output current of the second PMOS transistor 204 decreases. In some instances, such as with a large input current, the output current of the second PMOS transistor 204 is shut off and does not conduct current from the supply voltage $V_{DD}$ to the output terminal 214. In this way, the output transistors 204 and 218 exhibit the desired push-pull behavior based on a positive input current.

In a further illustrative implementation, a quiescent condition of the AB amplifier output stage circuit arrangement 200 occurs when no current is provided by the first input current source 210 or the second input current source 224. In the quiescent condition, the current provided by the reference current source 212 is mirrored by the second PMOS transistor 204 and the second NMOS transistor 218. Under some circumstances, the first input current source 210, the second input current source 224, or a combination thereof, may produce some current during the quiescent condition, which may cause a mismatch condition.

Figure 3:
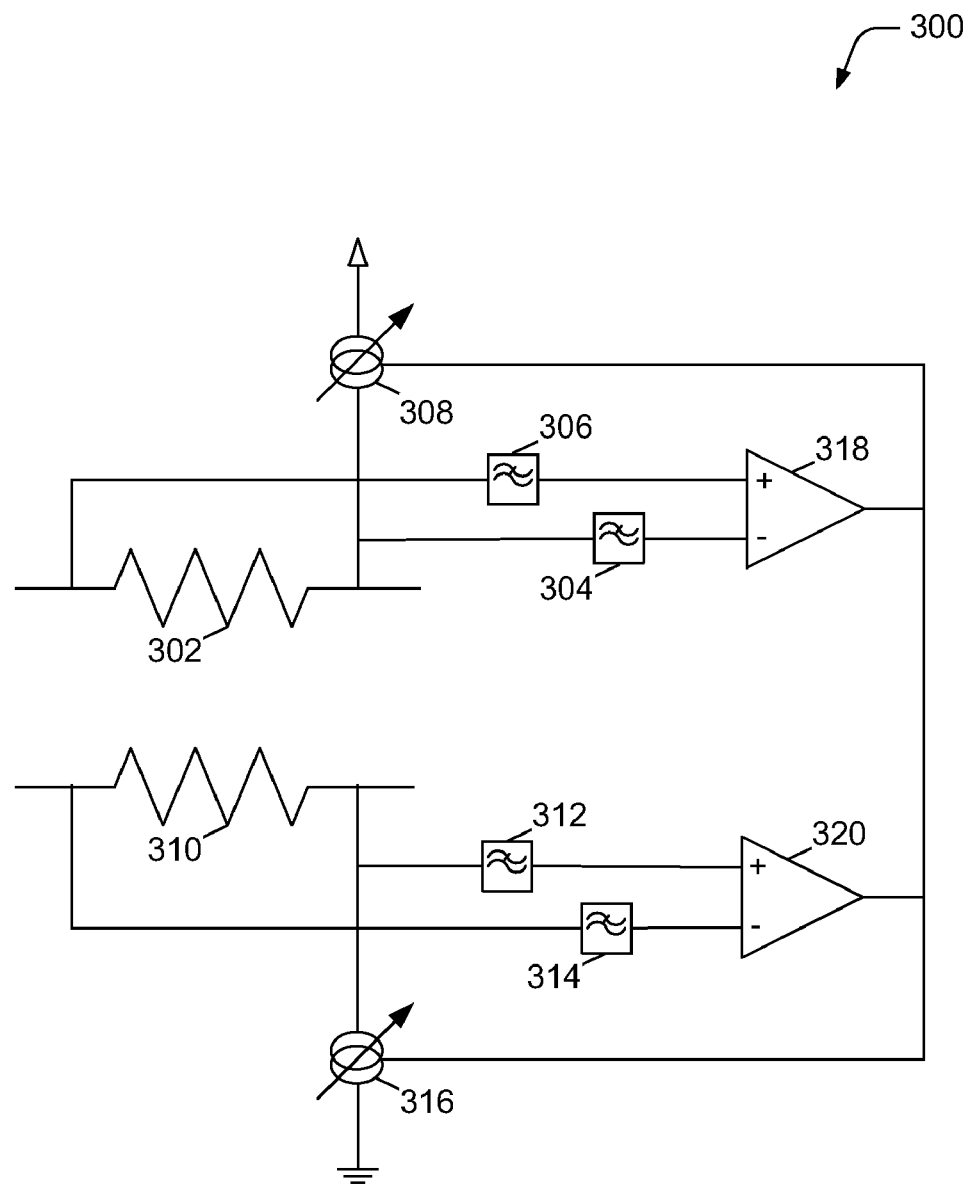
FIG. 3 is a schematic diagram of a monitoring circuit of a class AB amplifier output stage, where the monitoring circuit includes an operational transconductance amplifier arrangement.

FIG. 3 is a schematic diagram of a monitoring circuit 300 of a class AB amplifier output stage circuit arrangement, such as the class AB amplifier output stage circuit arrangement 200 of FIG. 2. The monitoring circuit 300 may be configured to offset mismatch that occurs in the class AB amplifier output stage circuit arrangement. A class AB amplifier output stage circuit arrangement including larger transistors and receiving an accurate steering current may have minimal mismatch; however, when transistors of a class AB amplifier output stage circuit arrangement are smaller in size, such as transistors of a high-speed amplifier, mismatch may have a detrimental effect on control of the quiescent current.

The monitoring circuit 300 includes a first impedance 302 of a class AB amplifier output stage. In some implementations, the first impedance 302 may correspond to the impedance 208 of FIG. 2. A first node of the first impedance 302 may be coupled to a low-pass filter 304 and a second node of the first impedance 302 may be coupled to a low-pass filter 306. In addition, the first node and the second node of the first impedance 302 are coupled to a first auxiliary variable current source 308. In some implementations, the first auxiliary variable current source 308 may be connected in parallel with the first current source 210 of FIG. 2. In other implementations, the first auxiliary variable current source 308 and the first current source 210 of FIG. 2 may represent the same current source. For example, an output current of the monitoring circuit 300 and an input current to the class AB amplifier output stage 200 may be combined by a summer circuit (not shown), such as an op-amp, and fed into a single current source 308/210 that provides current across the first impedance 302/208.

The monitoring circuit 300 also includes a second impedance 310 of a class AB amplifier output stage. In some implementations, the second impedance 310 may correspond to the impedance 222 of FIG. 2. A first node of the second impedance 310 may be coupled to a low-pass filter 312 and a second node of the second impedance 310 may be coupled to a low-pass filter 314. The first node and the second node of the second impedance 310 are also coupled to a second auxiliary variable current source 316. In some implementations, the second auxiliary variable current source 316 may be connected in parallel with the second current source 224 of FIG. 2. In other implementations, the second auxiliary variable current source 316 and the second current source 224 of FIG. 2 may represent the same current source. For example, an output current of the monitoring circuit 300 and an input current to the class AB amplifier output stage 200 may be combined in a summer circuit (not shown), such as an op-amp, and fed into a single current source 316/224 that provides current across the second impedance 310/222. Further, in particular implementations, such as with linear circuits and small input signals, the low-pass filters 304, 306, 312, 314 may not be necessary.

Additionally, the monitoring circuit 300 includes a first operational transconductance amplifier (OTA) 318. A non-inverting node of the first OTA 318 is coupled to the low-pass filter 306 and an inverting node of the first OTA 318 is coupled to the low-pass filter 304. An output node of the first OTA 318 is coupled to the first auxiliary variable current source 308.

Further, the monitoring circuit 300 includes a second operational transconductance amplifier (OTA) 320. A non-inverting node of the second OTA 320 is coupled to the low-pass filter 312 and an inverting node of the second OTA 320 is coupled to the low-pass filter 314. An output node of the second OTA 320 is coupled to the second auxiliary variable current source 316. In addition, the output node of the second OTA 320 is coupled to the output node of the first OTA 318.

In an illustrative implementation, the first OTA 318 may determine a voltage drop of the first impedance 302 and the second OTA 320 may determine a voltage drop of the second impedance 310. The output current of the first OTA 318 is related to the voltage drop of the first impedance 302 and the output current of the second OTA 320 is related to the voltage drop of the second impedance 310. In some implementations, the voltage drop of the first impedance 302 and the voltage drop of the second impedance 310 are approximately equal. When the voltage drop of the first impedance 302 and the voltage drop of the second impedance 310 are approximately equal, the respective output currents of the first OTA 318 and the second OTA 320 cancel each other and have a sum of zero or approximately zero.

In other implementations, the voltage drop of the first impedance 302 may be different from the voltage drop of the second impedance 310. For example, the voltage drop of the first impedance 302 and the voltage drop of the second impedance 310 may be different due to differing currents across the first impedance 302 and the second impedance 310 of the class AB amplifier output stage. To illustrate, during a quiescent condition of the class AB amplifier output stage, a first current source of the class AB amplifier output stage may produce a slightly positive current and/or a second current source of the class AB amplifier output stage may produce a slightly negative current. Consequently, an impedance coupled to the first current source would have a different voltage drop than an impedance coupled to the second current source resulting in mismatch of the class AB amplifier output stage.

When the voltage drop of the first impedance 302 and the voltage drop of the second impedance 310 are different, the output current of the first OTA 318 and the output current of the second OTA 320 drive the first auxiliary variable current source 308, the second auxiliary variable current source 316, or a combination thereof, to generate a compensating current, such that the voltage drop of the first impedance 302 and the voltage drop of the second impedance 310 are adjusted to be approximately equal. Thus, the monitoring circuit 300 relies on a closed regulation loop to equalize the voltage drop of the first impedance 302 and the voltage drop of the second impedance 310, so that the class AB amplifier output stage will avoid the effect of mismatch and subsequently produce a correct output current as designed.

In some implementations when the voltage drop of the first impedance 302 and the voltage drop of the second impedance 310 are different, the first auxiliary variable current source 308 and the second auxiliary variable current source 316 may receive the combined output currents of the first OTA 318 and the second OTA 320 and produce respective compensating currents such that the voltage drop of the first impedance 302 and the voltage drop of the second impedance 310 are adjusted to be approximately equal. For example, when a slightly negative current is provided to the first impedance 302 during the quiescent condition, the first auxiliary variable current source 308 may provide a slightly positive compensating current. Moreover, when a slightly positive current is provided to the first impedance 302 during the quiescent condition, the first auxiliary variable current source 308 may provide a slightly negative compensating current. In another example, when a slightly positive current is provided to the second impedance 310 during the quiescent condition, the second auxiliary variable current source 316 may provide a slightly negative compensating current. Furthermore, when a slightly negative current is provided to the second impedance 310 during the quiescent condition, the second auxiliary variable current source 316 may provide a slightly positive compensating current.

In other implementations, the monitoring circuit 300 may include one auxiliary variable current source rather than the first auxiliary variable current source 308 and the second auxiliary variable current source 316 as shown in FIG. 3. For example, the monitoring circuit 300 may include an auxiliary variable current source to provide compensating current to the first impedance 302. In this example, when the voltage drop of the first impedance 302 and the voltage drop of the second impedance 310 are different, the auxiliary variable current source provides a compensating current to the first impedance 302 based on the output signals of the first OTA 318 and the second OTA 320, such that the voltage drop of the first impedance 302 and the voltage drop of the second impedance 310 are adjusted to be approximately equal. In another example, the monitoring circuit 300 may include an auxiliary variable current source to provide compensating current to the second impedance 310. In this example, when the voltage drop of the first impedance 302 and the voltage drop of the second impedance 310 are different, the auxiliary variable current source provides a compensating current to the second impedance 310 based on the output signals of the first OTA 318 and the second OTA 320, such that the voltage drop of the first impedance 302 and the voltage drop of the second impedance 310 are adjusted to be approximately equal.

Figure 4:
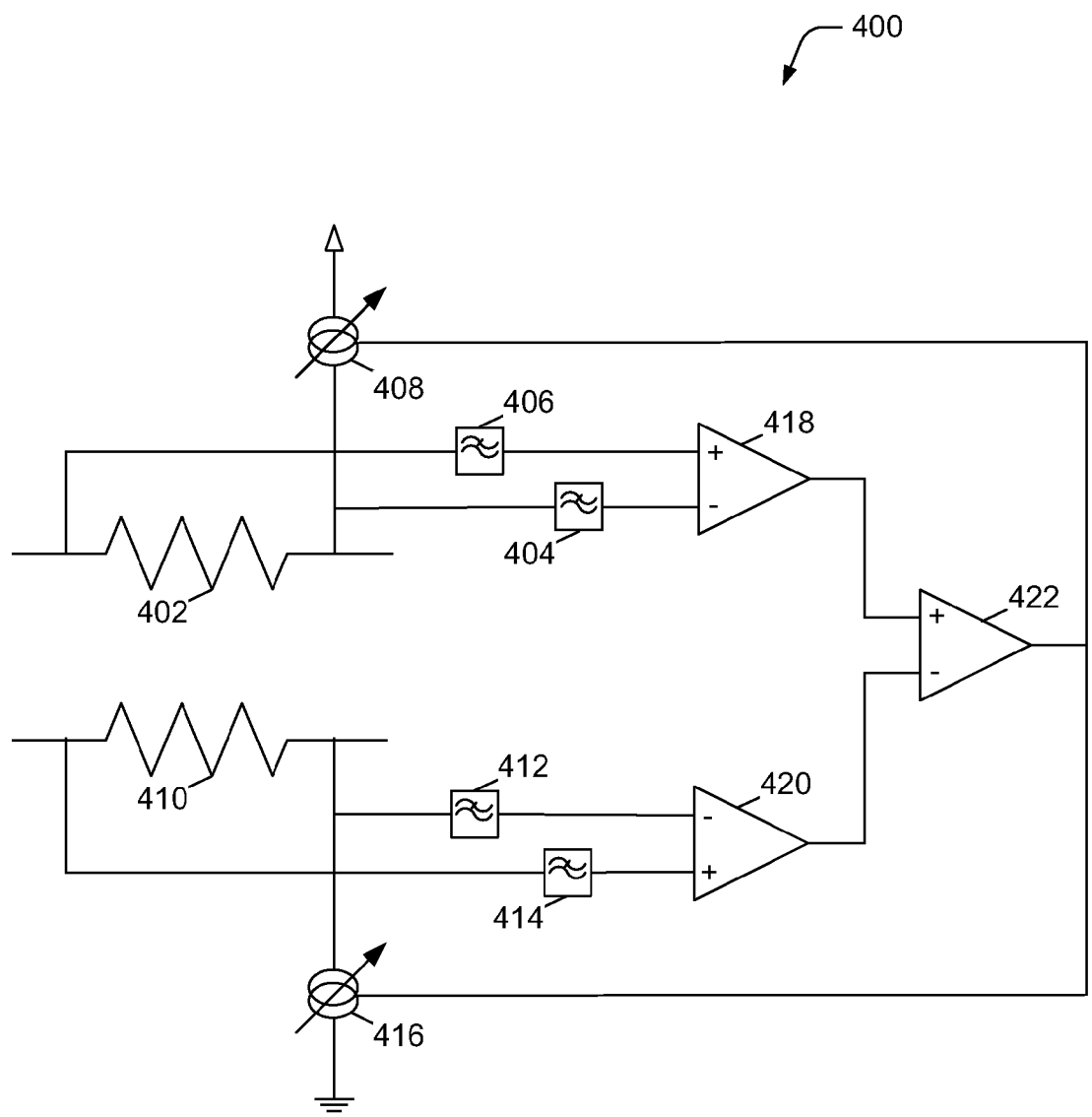
FIG. 4 is a schematic diagram of a monitoring circuit of a class AB amplifier output stage, where the monitoring circuit includes a differential amplifier arrangement.

FIG. 4 is a schematic diagram of a monitoring circuit 400 of a class AB amplifier output stage circuit arrangement, such as the class AB amplifier output stage circuit arrangement 200 of FIG. 2. The monitoring circuit 400 may be configured to offset mismatch that occurs in the class AB amplifier output stage circuit arrangement.

The monitoring circuit 400 includes a first impedance 402 of a class AB amplifier output stage. In some implementations, the first impedance 402 may correspond to the first impedance 208 of FIG. 2. A first node of the first impedance 402 may be coupled to a low-pass filter 404 and a second node of the first impedance 402 may be coupled to a low-pass filter 406. In addition, the first node and the second node of the first impedance 402 are coupled to a first auxiliary variable current source 408. In some implementations, the first auxiliary variable current source 408 may be connected in parallel with the first current source 210 of FIG. 2, while in other implementations the first auxiliary variable current source 408 and the first current source 210 of FIG. 2 may represent the same current source.

The monitoring circuit 400 also includes a second impedance 410 of a class AB amplifier output stage. In some implementations, the second impedance 410 may correspond to the second impedance 222 of FIG. 2. A first node of the second impedance 410 may be coupled to a low-pass filter 412 and a second node of the second impedance 410 may be coupled to a low-pass filter 414. The first node and the second node of the second impedance 410 are also coupled to a second auxiliary variable current source 416. In some implementations, the second auxiliary variable current source 416 may be connected in parallel with the second current source 224 of FIG. 2, while in other implementations the second auxiliary variable current source 416 and the second current source 224 of FIG. 2 may represent the same current source. Further, in particular implementations, the low-pass filters 404, 406, 412, 414 may not be necessary.

Additionally, the monitoring circuit 400 includes a first differential amplifier 418. A non-inverting node of the first differential amplifier 418 is coupled to the low-pass filter 406 and an inverting node of the first differential amplifier 418 is coupled to the low-pass filter 404. Further, the monitoring circuit 400 includes a second differential amplifier 420. An inverting node of the second differential amplifier 420 is coupled to the low-pass filter 412 and a non-inverting node of the second differential amplifier 420 is coupled to the low-pass filter 414. An output node of the first differential amplifier 418 is coupled to a non-inverting node of a third differential amplifier 422 and an output node of the second differential amplifier 420 is coupled to an inverting node of the third differential amplifier 422. The output node of the third differential amplifier 422 is coupled in a negative feedback loop to the first auxiliary variable current source 408 and to the second auxiliary variable current source 416.

In an illustrative implementation, the first differential amplifier 418 may determine a voltage drop of the first impedance 402 and provide a corresponding output signal to the third differential amplifier 422. The second differential amplifier 420 may determine a voltage drop of the second impedance 410 and provide a corresponding output signal to the third differential amplifier 422. The third differential amplifier 422 may determine whether or not there is a difference between the voltage drop of the first impedance 402 and the voltage drop of the second impedance 410. The output signal of the third differential amplifier 422 may drive the first auxiliary variable current source 408 and the second auxiliary current source 416. For example, when there is a difference between the voltage drop of the first impedance 402 and the voltage drop of the second impedance 410, the third differential amplifier 422 may drive the first auxiliary variable current source 408, the second auxiliary variable current source 416, or a combination thereof, to produce a compensating current such that the voltage drop of the first impedance 402 and the voltage drop of the second impedance 410 are adjusted to be approximately equal.

Further, the monitoring circuit 400 may be implemented with one auxiliary variable current source, rather than the first auxiliary variable current source 408 and the second auxiliary variable current source 416 shown in FIG. 4. The single auxiliary variable current source may be coupled to the first impedance 402 or the second impedance 410. The single auxiliary variable current source may provide a compensating current to the first impedance 402 or the second impedance 410 based on the output signal of the third differential amplifier 422 when the voltage drop of the first impedance 402 and the voltage drop of the second impedance 410 are different, such that the voltage drop of the first impedance 402 and the voltage drop of the second impedance 410 are adjusted to be approximately equal.

Figure 5:
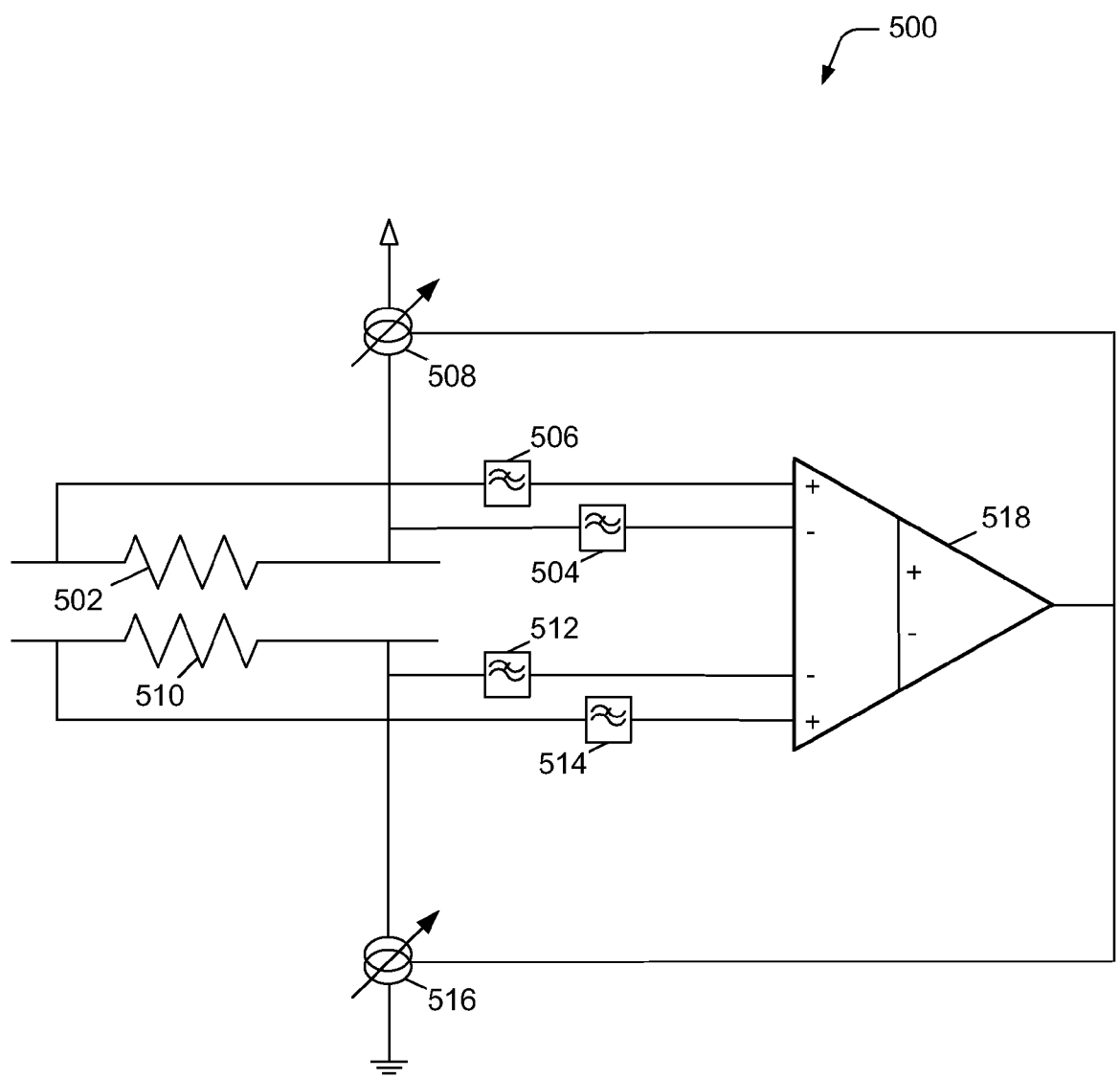
FIG. 5 is a schematic diagram of a monitoring circuit of a class AB amplifier output stage, where the monitoring circuit includes a differential difference amplifier.

FIG. 5 is a schematic diagram of a monitoring circuit 500 of a class AB amplifier output stage circuit arrangement, such as the class AB amplifier output stage circuit arrangement 200 of FIG. 2. The monitoring circuit 500 may be configured to offset mismatch that occurs in the class AB amplifier output stage circuit arrangement.

The monitoring circuit 500 includes a first impedance 502 of a class AB amplifier output stage. In some implementations, the first impedance 502 may correspond to the first impedance 208 of FIG. 2. A first node of the first impedance 502 may be coupled to a low-pass filter 504 and a second node of the first impedance 502 may be coupled to a low-pass filter 506. In addition, the first node and the second node of the first impedance 502 are coupled to a first auxiliary variable current source 508. In some implementations, the first auxiliary variable current source 508 may be connected in parallel with the first current source 210 of FIG. 2, while in other implementations the first auxiliary variable current source 508 and the first current source 210 of FIG. 2 may represent the same current source.

The monitoring circuit 500 also includes a second impedance 510 of a class AB amplifier output stage. In some implementations, the second impedance 510 may correspond to the second impedance 222 of FIG. 2. A first node of the second impedance 510 may be coupled to a low-pass filter 512 and a second node of the second impedance 510 may be coupled to a low-pass filter 514. The first node and the second node of the second impedance 510 are also coupled to a second auxiliary variable current source 516. In some implementations, the second auxiliary variable current source 516 may be connected in parallel with the second current source 224 of FIG. 2, while in other implementations the second auxiliary variable current source 516 and the second current source 224 of FIG. 2 may represent the same current source. Further, in particular implementations, the low-pass filters 504, 506, 512, 514 may not be necessary.

Additionally, the monitoring circuit 500 includes a differential difference amplifier 518. A first non-inverting node of the differential difference amplifier 518 is coupled to the low-pass filter 506 and a first inverting node of the differential difference amplifier 518 is coupled to the low-pass filter 504. Further, a second inverting node of the differential difference amplifier 518 is coupled to the low-pass filter 512 and a second non-inverting node of the differential difference amplifier 518 is coupled to the low-pass filter 514. An output node of the differential difference amplifier 518 is coupled in a negative feedback loop to the first auxiliary variable current source 508 and to the second auxiliary variable current source 516.

In an illustrative implementation, the differential difference amplifier 518 may determine a voltage drop of the first impedance 502 and a voltage drop of the second impedance 510. The differential difference amplifier 518 may also determine whether or not there is a difference between the voltage drop of the first impedance 502 and the voltage drop of the second impedance 510. The output signal of the differential difference amplifier 518 may drive the first auxiliary variable current source 508 and the second auxiliary current source 516. For example, when there is a difference between the voltage drop of the first impedance 502 and the voltage drop of the second impedance 510, the differential difference amplifier 518 may drive the first auxiliary variable current source 508, the second auxiliary variable current source 516, or a combination thereof, to produce a compensating current such that the voltage drop of the first impedance 502 and the voltage drop of the second impedance 510 are adjusted to be approximately equal.

Figure 6:
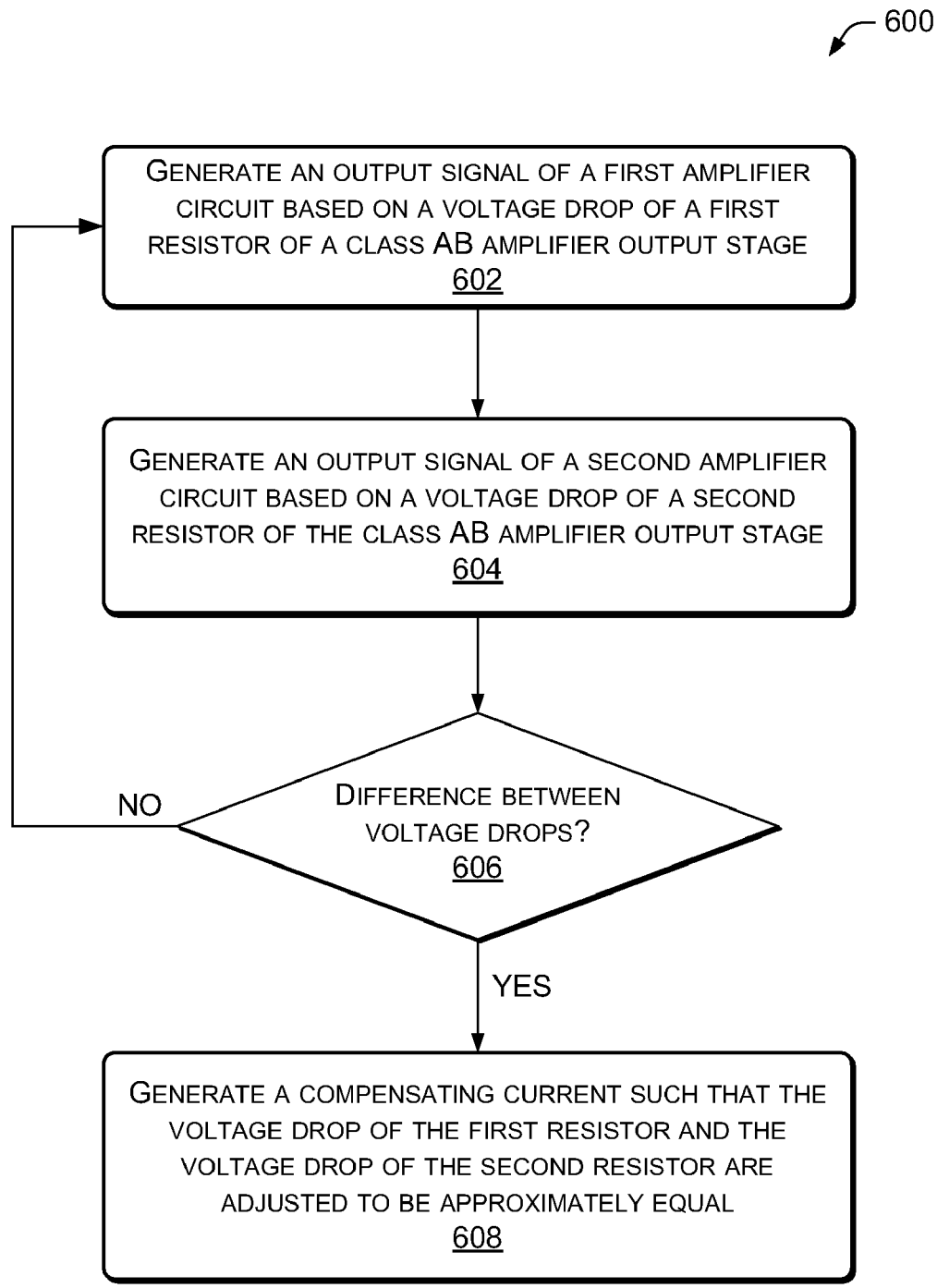
FIG. 6 is a flow diagram of a method of correcting mismatch in a class AB amplifier output stage.

FIG. 6 is a flow diagram of a method 600 of correcting mismatch in a class AB amplifier output stage. The method 600 may utilize a monitoring circuit to correct mismatch in the class AB amplifier output stage. The class AB amplifier output stage may be the class AB amplifier output stage 200 illustrated in FIG. 2 and the monitoring circuit may be the monitoring circuit 300 shown in FIG. 3, the monitoring circuit 400 of FIG. 4, or the monitoring circuit 500 of FIG. 5. The class AB amplifier output stage and the monitoring circuit may be included in a high-speed amplifier.

Specifics of exemplary methods are described below. However, it should be understood that certain acts need not be performed in the order described, and may be modified, and/or may be omitted entirely, depending on the circumstances. Moreover, the acts described may be implemented by a computer, processor or other computing device based on instructions stored on one or more computer-readable media. The computer-readable media can be any available media that can be accessed by a computing device to implement the instructions stored thereon.

At 602, the method 600 includes generating an output signal of a first amplifier circuit, such as an operational transconductance amplifier (OTA) or a differential amplifier, based on a voltage drop of a first impedance of a class AB amplifier output stage. The first impedance may be the impedance 208 of FIG. 2 and/or the impedance 302 of FIG. 3, or the impedance 402 of FIG. 4. In addition, the first amplifier circuit may be the first OTA 318 of FIG. 3 or the first differential amplifier 418 of FIG. 4. At 604, a second amplifier circuit, such as an OTA or a differential amplifier, generates an output signal based on a voltage drop of a second impedance of a class AB amplifier output stage. The second impedance may be the impedance 222 of FIG. 2 and/or the impedance 310 of FIG. 3, or the impedance 410 of FIG. 4. The second amplifier circuit may be the second OTA 320 of FIG. 3 or the second differential amplifier 420 of FIG. 4. In some implementations, the first amplifier circuit and the second amplifier circuit may represent the functionality of the differential difference amplifier 518 of FIG. 5 and the impedance 502 of FIG. 5 may represent the first impedance and the impedance 510 of FIG. 5 may represent the second impedance.

At decision 606, the method 600 includes determining whether the voltage drop of the first impedance and the voltage drop of the second impedance are different. When there is not a difference between the voltage drop of the first impedance and the voltage drop of the second impedance, the method returns to 602. When there is a difference between the voltage drop of the first impedance and a voltage drop of the second impedance, the method advances to 608. At 608, a compensating current is generated such that the voltage drop of the first impedance and the voltage drop of the second impedance are adjusted to be approximately equal. The compensating current may be generated by one or more current sources of the monitoring circuit. In implementations where the first amplifier circuit and the second amplifier circuit are OTAs, the one or more current sources may be driven by the output currents of the OTAs. Further, in implementations where the first amplifier circuit and the second amplifier circuit are differential amplifiers, the output signals of the differential amplifiers may be fed into an additional differential amplifier that produces an output signal to drive the one or more current sources.

CONCLUSION

For the purposes of this disclosure and the claims that follow, the terms "coupled" and "connected" have been used to describe how various elements interface. Such described interfacing of various elements may be either direct or indirect. Although the subject matter has been described in language specific to structural features and/or methodological acts, it is to be understood that the subject matter defined in the appended claims is not necessarily limited to the specific features or acts described. Rather, the specific features and acts are disclosed as preferred forms of implementing the claims. The specific features and acts described in this disclosure and variations of these specific features and acts may be implemented separately or may be combined.

I claim:

1. An apparatus comprising:
a first current mirror arrangement coupled to a first input signal arrangement, the first input signal arrangement comprising a first input current source and a first impedance, the first impedance being at least one physical circuit element; and
a second current mirror arrangement coupled to a second input signal arrangement, the second input signal arrangement comprising a second input current source and a second impedance, the second impedance being at least one physical circuit element, and wherein the second current mirror arrangement is coupled to the first current mirror arrangement,
wherein the second current mirror arrangement is coupled to the first current mirror arrangement via a reference current source.

2. The apparatus of claim 1, wherein the first current mirror arrangement comprises a first positive channel metal oxide semiconductor (PMOS) transistor and a second PMOS transistor.

3. The apparatus of claim 2, wherein a gate of the first PMOS transistor is coupled to the first impedance and a drain of the first PMOS transistor is coupled to the reference current source.

4. The apparatus of claim 2, wherein a gate of the second PMOS transistor is coupled to the first impedance and to the first input current source, a drain of the second PMOS transistor is coupled to an output terminal, and a source of the second PMOS transistor is coupled to a supply voltage.

5. The apparatus of claim 1, wherein the second current mirror arrangement comprises a first negative channel metal oxide semiconductor (NMOS) transistor and a second NMOS transistor.

6. The apparatus of claim 5, wherein a gate of the first NMOS transistor is coupled to the second impedance, a drain of the first NMOS transistor is coupled to a reference current source, and a source of the first NMOS transistor is coupled to a ground.

7. The apparatus of claim 5, wherein a gate of the second NMOS transistor is coupled to the second impedance and to the second input current source, a drain of the second NMOS transistor is coupled to an output terminal, and a source of the second NMOS transistor is coupled to a ground.

8. An apparatus comprising:
a first current mirror arrangement coupled to a first input signal arrangement, the first input signal arrangement comprising a first input current source and a first physical resistive device; and
a second current mirror arrangement coupled to a second input signal arrangement, the second input signal arrangement comprising a second input current source and a second physical resistive device, and wherein the second current mirror arrangement is coupled to the first current mirror arrangement
wherein the second current mirror arrangement is coupled to the first current mirror arrangement via a reference current source.

9. The apparatus according to claim 8, wherein the first and second current mirror arrangements each comprise two transistors, the first physical resistive device coupled between drains of the two transistors of the first current mirror arrangement and the second physical resistive device coupled between drains of the two transistors of the second current mirror arrangement.

* * * * *